(12) United States Patent
Chu

(10) Patent No.: US 7,839,700 B2
(45) Date of Patent: Nov. 23, 2010

(54) INTERNAL VOLTAGE GENERATING CIRCUIT AND SEMICONDUCTOR MEMORY DEVICE USING THE SAME

(75) Inventor: Gyo Soo Chu, Icheon-si (KR)

(73) Assignee: Hynix Semiconductor Inc., Icheon-si (KR)

(*) Notice: Subject to any disclaimer, the term of this patent is extended or adjusted under 35 U.S.C. 154(b) by 217 days.

(21) Appl. No.: 12/156,835

(22) Filed: Jun. 5, 2008

(65) Prior Publication Data
US 2009/0168582 A1 Jul. 2, 2009

(30) Foreign Application Priority Data
Dec. 28, 2007 (KR) .................. 10-2007-0141042

(51) Int. Cl.
*G11C 5/14* (2006.01)
(52) U.S. Cl. .................. 365/189.09; 365/189.11; 365/211
(58) Field of Classification Search ............ 365/189.09, 365/189.11, 211
See application file for complete search history.

(56) References Cited

U.S. PATENT DOCUMENTS 6,452,437 B1 * 9/2002 Takeuchi et al. ............ 327/513

7,606,099 B2 * 10/2009 Chung ..................... 365/211
2008/0042736 A1 2/2008 Byeon

FOREIGN PATENT DOCUMENTS

| KR | 10-2002-0039809 A | 5/2002 |
|---|---|---|
| KR | 10-2007-0080883 A | 8/2007 |
| KR | 10-2007-0115712 A | 12/2007 |
| KR | 10-0784909 B1 | 12/2007 |

* cited by examiner

*Primary Examiner*—Son Dinh
*Assistant Examiner*—Nam Nguyen
(74) *Attorney, Agent, or Firm*—John P. White; Cooper & Dunham LLP

(57) ABSTRACT

An internal voltage generating circuit includes a voltage divider for generating a level signal by voltage-dividing first internal voltage, a pull-down signal generator for generating a pull-down signal, which has a level adjusted according to a temperature, in response to the level signal, a pull-up signal generator for generating a pull-up signal, which has a level adjusted according to the temperature, in response to the level signal, and a driving unit for driving second internal voltage in response to the pull-down signal and the pull-up signal. Driving force of the driving unit for driving the second internal voltage is changed according to the temperature.

22 Claims, 2 Drawing Sheets

INTERNAL VOLTAGE GENERATING CIRCUIT AND SEMICONDUCTOR MEMORY DEVICE USING THE SAME

TECHNICAL FIELD

The present disclosure relates to a semiconductor memory device. More particularly, the present disclosure relates to an internal voltage generating circuit having a predetermined driving force regardless of temperature variation.

BACKGROUND

A DRAM (dynamic random access memory) is a representative device of a semiconductor memory device, in which one transistor and one capacitor forms a memory cell. The memory cell of the DRAM requires refresh for a retention operation of data. As the DRAM has a high density, a cell size is reduced and operating current is gradually reduced. Thus, stable data retention operation is more and more important.

The capacitor constituting the memory cell of the DRAM is a storage capacitor for storing data. The storage capacitor includes a storage electrode for storing data and a cell plate electrode for increasing data retention time. Typically, cell plate voltage VCP generated at a level corresponding to about ½ of core voltage VCORE is supplied to the cell plate electrode. The voltage VCP generated at the level corresponding to about ½ of the core voltage VCORE is also used as bit line precharge voltage VBLP to provide criterion for signal detection.

An internal voltage generating circuit, which generates voltage used as cell plate voltage VCP and bit line precharge voltage VBLP, must generate internal voltage stably driven regardless of temperature variation. Since the internal voltage generating circuit includes a plurality of PMOS transistors and a plurality of NMOS transistors, driving force for generating the internal voltage is changed as temperature changes. Referring to Table 1 below, as the temperature changes, variation of threshold voltage of a PMOS transistor is greater than that of an NMOS transistor. Further, as the threshold voltage changes, variation of current driving force of an NMOS transistor is greater than that of a PMOS transistor. Thus, the level of the internal voltage generated through PMOS and NMOS transistors is changed as temperature changes.

TABLE 1

| Type | | −40° C. | 25° C. | 90° C. |
|---|---|---|---|---|
| NMOS type | VTE (V) | 0.531 | 0.477 | 0.430 |
| | Idsat (A) | 4.330 | 3.979 | 3.704 |
| PMOS type | VTE (V) | 0.799 | 0.630 | 0.467 |
| | Idsat (A) | 1.220 | 1.381 | 1.513 |

SUMMARY

In an aspect of the present disclosure, an internal voltage generating circuit is provided having a predetermined driving force regardless of temperature variation.

In an embodiment of the present disclosure, there is provided an internal voltage generating circuit including a voltage divider for generating a level signal by voltage-dividing first internal voltage, a pull-down signal generator for generating a pull-down signal, which has a level adjusted according to a temperature, in response to the level signal, a pull-up signal generator for generating a pull-up signal, which has a level adjusted according to the temperature, in response to the level signal, and a driving unit for driving second internal voltage in response to the pull-down signal and the pull-up signal, wherein a driving force of the driving unit for driving the second internal voltage is changed according to the temperature.

The voltage divider can include a first resistor connected between the first internal voltage and a first node through which the level signal is output, and a second resistor connected between the first node and ground voltage.

The pull-down signal generator can include a first pull-up device for pull-up driving a second node in response to the level signal, a first level setting unit for setting a level of a third node in response to a signal of the second node, a second level setting unit for receiving the signal of the second node and set a level of a fourth node according to the temperature, a first current mirror unit connected to the first node, to which the level signal is input, and a fifth node, to which the second internal voltage is input, to serve as a constant current source in response to a signal of the fourth node, and a first driving force adjustment unit for pull-down driving a sixth node, through which the pull-down signal is output, in response to the signal of the second node while adjusting a pull-down driving force according to the temperature.

The second level setting unit can include a transfer device for transferring the signal of the second node to a seventh node in response to a temperature signal enabled at a low temperature, a first pull-down device for pull-down driving the seventh node in response to the temperature signal, and a second pull-down device for pull-down driving the fourth node in response to a signal of the second node.

The first driving force adjustment unit can include a first pull-down device for pull-down driving the sixth node in response to the signal of the second node, a transfer device for transferring the signal of the second node to a seventh node in response to a temperature signal enabled at a low temperature, a second pull-down device for pull-down driving the seventh node in response to the temperature signal, and a third pull-down device for pull-down driving the sixth node in response to a signal of the seventh node.

The pull-up signal generator can include a third level setting unit connected to the first internal voltage to set a level of a seventh node in response to a signal of the third node, a second current mirror unit connected to the first and fifth nodes to serve as a constant current source in response to a signal of a seventh node, and a second driving force adjustment unit for pull-up driving an eighth node, through which the pull-up signal is output, in response to a signal of the third node while adjusting a pull-up driving force according to the temperature.

The second driving force adjustment unit can include a second pull-up device for pull-up driving the eighth node in response to the signal of the third node, a transfer device for transferring the signal of the third node to a ninth node in response to a temperature signal enabled at a low temperature, a third pull-up device for pull-up driving the ninth node in response to the temperature signal, and a fourth pull-up device for pull-up driving the eighth node in response to a signal of the ninth node.

The driving unit can include a pull-up driving section for pull-up driving the second internal voltage in response to the pull-up signal while adjusting a pull-up driving force according to the temperature, and a pull-down driving section for pull-down driving the second internal voltage in response to the pull-down signal while adjusting a pull-down driving force according to the temperature.

The pull-up driving section can include a first pull-up device for pull-up driving a first node, through which the second internal voltage is output, in response to the pull-up signal, a transfer device for transferring the pull-up signal to a second node in response to a temperature signal enabled at a low temperature, a second pull-up device for pull-up driving the second node in response to the temperature signal, and a third pull-up device for pull-up driving the first node in response to a signal of the second node.

The pull-down driving section can include a first pull-down device for pull-down driving a first node, through which the second internal voltage is output, in response to the pull-down signal, a transfer device for transferring the pull-up signal to a second node in response to a temperature signal enabled at a low temperature, a second pull-down device for pull-down driving the second node in response to the temperature signal, and a third pull-down device for pull-down driving the first node in response to a signal of the second node.

In another aspect of the present disclosure, there is provided a semiconductor memory device including: a temperature sensor for generating a temperature signal enabled at a low temperature, and an internal voltage generating circuit for generating a second internal voltage from a first internal voltage by a driving force determined according to the temperature signal, wherein the driving force of the internal voltage generating circuit is determined according to the temperature signal, the second internal voltage is supplied as bit line precharge voltage or cell plate voltage.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF PREFERRED EMBODIMENTS

Hereinafter, the present invention will be described in detail through examples and embodiments. The examples and embodiments exemplify the present invention. However, the scope of the present disclosure is not limited by them.

Figure 1:
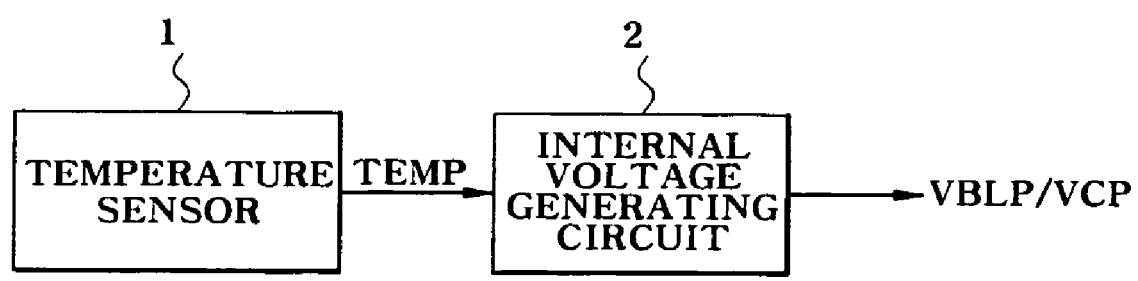
FIG. 1 is a block diagram illustrating the construction of a semiconductor memory device according to an embodiment of the present disclosure.
Figure 2:
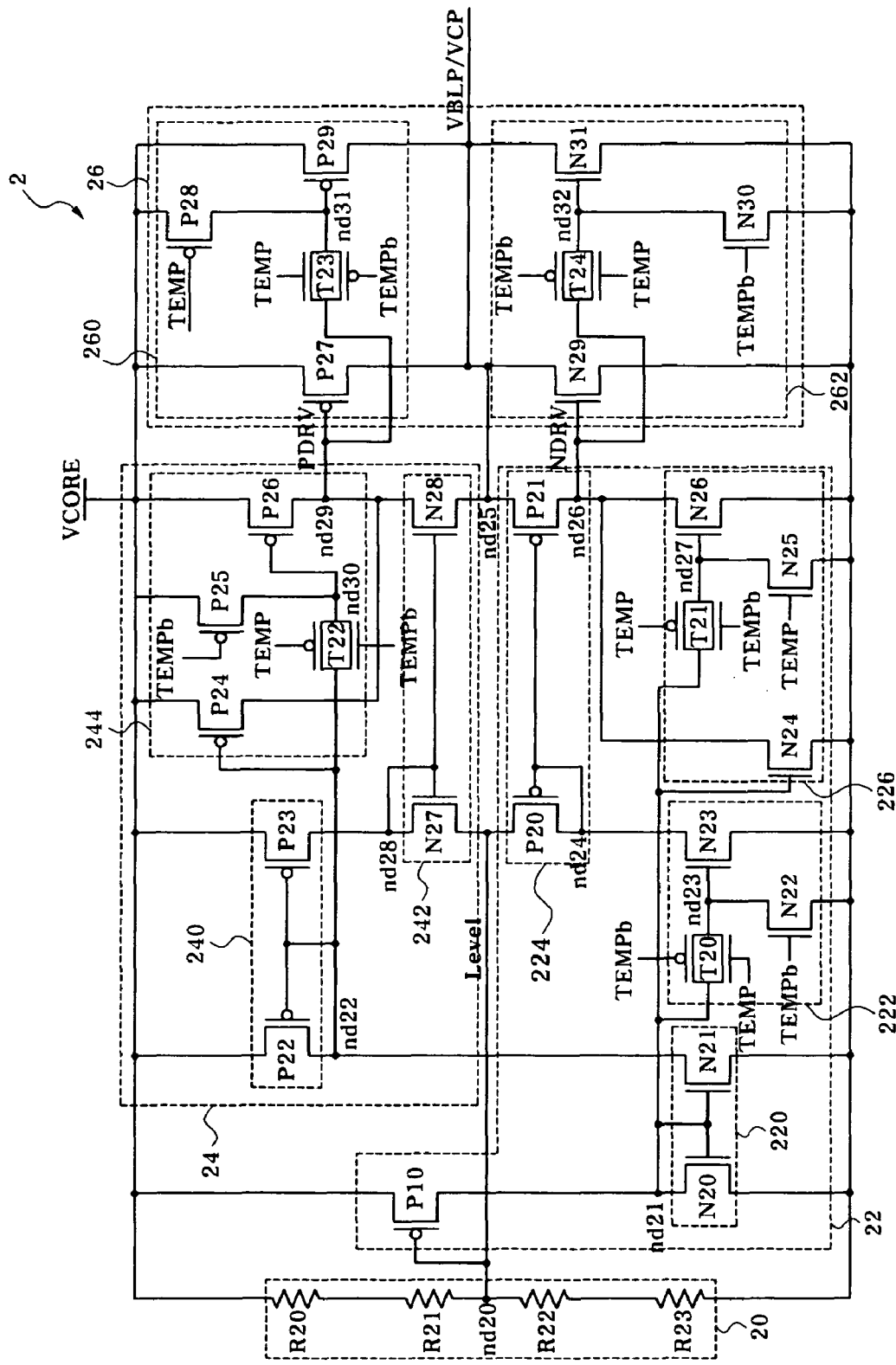
FIG. 2 is a circuit diagram of an internal voltage generating circuit included in the semiconductor memory device shown in FIG. 1.

FIG. 1 is a block diagram illustrating the construction of a semiconductor memory device according to an embodiment of the present invention, and FIG. 2 is a circuit diagram of an internal voltage generating circuit included in the semiconductor memory device shown in FIG. 1.

As illustrated in FIG. 1, the semiconductor memory device according to the present embodiment includes a temperature sensor 1 and an internal voltage generating circuit 2. The temperature sensor 1 generates a temperature signal TEMP enabled into a high level at a low temperature. The internal voltage generating circuit 2 receives the temperature signal TEMP and generates internal voltage VBLP/VCP, which is used as bit line precharge voltage or cell plate voltage VCP, from core voltage VCORE. The driving force of the internal voltage generating circuit 2 is determined according to the temperature signal TEMP.

As illustrated in FIG. 2, the internal voltage generating circuit 2 includes a voltage divider 20, a pull-down signal generator 22, a pull-up signal generator 24 and a driving unit 26.

The voltage divider 20 includes first resistors R20 and R21, which are serially connected between core voltage VCORE and a node nd20 through which a level signal Level is output, and second resistors R22 and R23 serially connected between the node nd20 and ground voltage VSS. The level signal Level is generated at a level corresponding to about ½ of the core voltage VCORE.

The pull-down signal generator 22 includes a PMOS transistor P10 that pull-up drives a node nd21 in response to the level signal Level, a first level setting unit 220, a second level setting unit 222, a first current mirror unit 224 and a first driving force adjustment unit 226.

The first level setting unit 220 includes NMOS transistors N20 and N21 that set a signal of a node nd22 at a low level in response to a signal of the node nd21. The second level setting unit 222 includes a transfer gate T20, and an NMOS transistors N22 and N23. The transfer gate T20 transfers the signal of the node nd21 to a node nd23 in response to the temperature signal TEMP enabled into a high level when the internal temperature of the semiconductor memory device is low. The NMOS transistor N22 pull-down drives the node nd23 in response to an inverse temperature signal TEMPb obtained by inverting the temperature signal TEMP. The NMOS transistor N23 pull-down drives a node nd24 in response to a signal of the node nd23.

The first current mirror unit 224 includes PMOS transistors P20 and P21 that receive a signal of the node nd24 and form current mirrors in order to serve as constant current sources between the node nd20 and the node nd24 and between a node nd25 and a node nd26, respectively. The first driving force adjustment unit 226 includes an NMOS transistor N24, a transfer gate T21 and NMOS transistors N25 and N26. The NMOS transistor N24 pull-down drives the node nd26 in response to the signal of the node nd21. The transfer gate T21 transfers the signal of the node nd21 to a node nd27 in response to the temperature signal TEMP. The NMOS transistor N25 pull-down drives the node nd27 in response to the temperature signal TEMP. The NMOS transistor N26 pull-down drives the node nd26, through which a pull-down signal NDRV is output, in response to a signal of the node nd27.

The pull-up signal generator 24 includes a third level setting unit 240, a second current mirror unit 242 and a second driving force adjustment unit 244.

The third level setting unit 240 includes PMOS transistors P22 and P23 that set a signal of a node nd28 at a high level in response to the signal of the node nd22. The second current mirror unit 242 includes NMOS transistors N27 and N28 that receive the signal of the node nd28 and form current mirrors in order to serve as constant current sources between the node nd20 and the node nd28 and between the node nd25 and a node nd29, respectively. The second driving force adjustment unit 244 includes a PMOS transistor P24, a transfer gate T22 and PMOS transistors P25 and P26. The PMOS transistor P24 pull-up drives the node nd29 in response to the signal of the node nd22. The transfer gate T22 transfers the signal of the node nd22 to a node nd30 in response to the temperature signal TEMP. The PMOS transistor P25 pull-up drives the node nd30 in response to the inverse temperature signal TEMPb. The PMOS transistor P26 pull-up drives the node nd29, through which a pull-up signal PDRV is output, in response to a signal of the node nd30.

The driving unit 26 includes a pull-up driving section 260 and a pull-down driving section 262.

The pull-up driving section 260 includes a PMOS transistor P27, a transfer gate T23, and PMOS transistors P28 and P29. The PMOS transistor P27 pull-up drives the node nd25 in response to the pull-up signal PDRV. The transfer gate T23 transfers the pull-up signal PDRV to a node nd31 in response to the temperature signal TEMP. The PMOS transistor P28 pull-up drives the node nd31 in response to the temperature signal TEMP. The PMOS transistor P29 pull-up drives the node nd25 in response to a signal of the node nd31.

The pull-down driving section 262 includes an NMOS transistor N29, a transfer gate T24, and NMOS transistors N30 and N31. The NMOS transistor N29 pull-down drives the node nd25 in response to the pull-down signal NDRV. The transfer gate T24 transfers the pull-down signal NDRV to a node nd32 in response to the temperature signal TEMP. The NMOS transistor N30 pull-down drives the node nd32 in response to the temperature signal TEMP. The NMOS transistor N31 pull-down drives the node nd25 in response to a signal of the node nd32.

The internal voltage generating circuit 2 having the construction as described above generates the internal voltage VBLP/VCP by comparing a level of the level signal Level, which is obtained by voltage-dividing the core voltage VCORE, with a level of the internal voltage VBLP/VCP. That is, when the internal voltage VBLP/VCP has a level lower than that of the level signal Level, the internal voltage generating circuit 2 increases pull-up driving force for the internal voltage VBLP/VCP by enabling the pull-up signal PDRV at a low level. In contrast, when the internal voltage VBLP/VCP has a level higher than that of the level signal Level, the internal voltage generating circuit 2 increases pull-down driving force for the internal voltage VBLP/VCP by enabling the pull-down signal NDRV at a high level.

However, as mentioned above, the PMOS and NMOS transistors have characteristic in which threshold voltage and current driving force change according to the temperature. Thus, a driving force for generating the internal voltage VBLP/VCP becomes weak at the low temperature and becomes strong at the high temperature, causing great current consumption.

Accordingly, the internal voltage generating circuit 2 of the present embodiment compensates for a weak driving force for generating the internal voltage VBLP/VCP at a low temperature by decreasing a driving force for pull-up driving the pull-up signal PDRV, decreasing a driving force for pull-down driving the pull-down signal NDRV and increasing the number of drivers for driving the internal voltage VBLP/VCP. In addition, the internal voltage generating circuit 2 of the present embodiment reduces a strong driving force for generating the internal voltage VBLP/VCP at a high temperature by increasing the driving force for pull-up driving the pull-up signal PDRV, increasing the driving force for pull-down driving the pull-down signal NDRV and decreasing the number of drivers for driving the internal voltage VBLP/VCP.

Hereinafter, operation of the semiconductor memory device that includes the internal voltage generating circuit 2 operating as described above will be described under the conditions in which the internal temperature of the semiconductor memory device is low and high.

When the internal temperature of the semiconductor memory device is low, the temperature sensor 1 generates the temperature signal TEMP at a high level. The internal voltage generating circuit 2 which receives the temperature signal TEMP generates the internal voltage VBLP/VCP using the core voltage VCORE. The driving force of the internal voltage generating circuit 2 is increased in accordance with the temperature signal TEMP at a high level. Hereinafter, the operation of the internal voltage generating circuit 2 will be described in more detail.

The voltage divider 20 generates the level signal Level by voltage-dividing the core voltage VCORE. The level signal Level is generated at a level corresponding to about ½ of the core voltage VCORE, and the PMOS transistor P20 which receives the level signal Level is turned on to pull-up drive the node nd21.

The signal of the driven node nd21 turns on the NMOS transistors N20 and N21, so that the node nd22 is pull-down driven. Further, the signal of the node nd21 is transferred to the node nd23 through the transfer gate T20, which is turned on by the temperature signal TEMP at a high level, to turn on the NMOS transistor N23, so that the node nd24 is pull-down driven. As the signal of the node nd24 is pull-down driven, the turn-on degree of the PMOS transistors P20 and P21 included in the first current mirror unit 224 can be increased. Thus, the amount of charges supplied to the node nd26 through the PMOS transistor P21 is increased. As a result, the driving force for pull-down driving the pull-down signal NDRV is increased.

At this time, since the transfer gate T21 included in the first driving force adjustment unit 226 is turned off and the NMOS transistor N25 is turned on, the node nd27 is pull-down driven. Thus, the turn-on degree of the NMOS transistors N26 is decreased. As a result, the driving force of the first driving force adjustment unit 226 that pull-down drives the node nd26 is decreased.

In brief, when the internal temperature of the semiconductor memory device is low, since the amount of charges supplied to the node nd26 through the PMOS transistor P21 included in the first current mirror unit 224 is increased and the amount of charges discharged from the node nd26 through the first driving force adjustment unit 226 is decreased, the pull-down signal NDRV generated in the node nd26 is generated at a higher level.

Further, the turn-on degree of the PMOS transistors P22 and P23 is increased by the signal of the pull-down driven node nd22, so that the node nd28 is pull-up driven. As the signal of the node nd28 is pull-up driven, the turn-on degree of the NMOS transistors N27 and N28 included in the second current mirror unit 242 is increased. Thus, the amount of charges discharged from the node nd29, in which the pull-up signal PDRV is generated, through the NMOS transistor N28 is increased.

At this time, the transfer gate T22 included in the second driving force adjustment unit 244 is turned off and the PMOS transistor P25 is turned on, so that the node nd30 is pull-up driven. Thus, the turn-on degree of the PMOS transistor P26 is decreased, so that the driving force of the second driving force adjustment unit 244 that pull-up drives the node nd29 is reduced.

In brief, when the internal temperature of the semiconductor memory device is low, since the amount of charges discharged from the node nd29 through the NMOS transistor N28 included in the second current mirror unit 242 is increased and the amount of charges supplied to the node nd29 through the second driving force adjustment unit 244 is decreased, the pull-up signal PDRV generated in the node nd29 is generated at a lower level.

Next, the driving unit 26 receives the pull-down signal NDRV formed at the higher level and the pull-up signal PDRV formed at the lower level to drive the internal voltage VBLP/VCP, so that the turn-on degree of the PMOS transistor P27 and the NMOS transistor N29 is increased. Thus, the driving force that generates the internal voltage VBLP/VCP is increased.

At this time, the transfer gate T23 included in the pull-up driving section 260 is turned on by the temperature signal TEMP at a high level, so that the internal voltage VBLP/VCP is pull-up driven through the PMOS transistor P29 as well as the PMOS transistor P27. In addition, the transfer gate T24 included in the pull-down driving section 262 is turned on by the temperature signal TEMP at the high level, so that the internal voltage VBLP/VCP is pull-down driven through the NMOS transistor N31 as well as the NMOS transistor N29.

In brief, the internal voltage generating circuit 2 of the present embodiment generates the pull-up signal PDRV at the lower level at the low temperature and increases the number of driver that drives the pull-up signal PDRV. Then, the internal voltage generating circuit 2 pull-up drives the internal voltage VBLP/VCP with higher driving force when the level of the internal voltage VBLP/VCP is lower than that of the level signal Level, thereby compensating for the driving force decreased by temperature reduction. Further, the internal voltage generating circuit 2 of the present embodiment generates the pull-down signal NDRV at the higher level at the low temperature and increases the number of drivers that drive the pull-down signal NDRV. Then, the internal voltage generating circuit 2 pull-down drives the internal voltage VBLP/VCP with higher driving force when the level of the internal voltage VBLP/VCP is higher than that of the level signal Level, thereby compensating for the driving force decreased by the temperature reduction.

Meanwhile, when the internal temperature of the semiconductor memory device is high, the temperature sensor 1 generates the temperature signal TEMP at a low level. The internal voltage generating circuit 2 that receives the temperature signal TEMP at the low level generates the internal voltage VBLP/VCP from the core voltage VCORE. The driving force of the internal voltage generating circuit 2 is reduced by the temperature signal TEMP at the low level. The voltage divider 20 generates the level signal Level by voltage-dividing the core voltage VCORE. The level signal Level is generated at a level corresponding to about ½ of the core voltage VCORE. The PMOS transistor P10 that receives the level signal Level is turned on to pull-up drive the node nd21.

The signal of the pull-up driven node nd21 turns on the NMOS transistors N20 and N21, so that the node nd22 is pull-down driven. At this time, the transfer gate T20 is turned off by the temperature signal TEMP at the low level and the NMOS transistor N22 is turned on, so that the turn-on degree of the NMOS transistor N23 is decreased. Thus, the driving force that pull-down drives the node nd24 is reduced and the turn-on degree of the PMOS transistors P20 and P21 included in the first current mirror unit 224 is decreased, so that the amount of charges supplied to the node nd26 through the PMOS transistor P21 is reduced. Consequently, the driving force that pull-up drives the pull-down signal NDRV is decreased.

At this time, the transfer gate T21 included in the first driving force adjustment unit 226 is turned on, so that the driving force of the first driving force adjustment unit 226 that pull-down drives the node nd26 is increased.

In brief, when the internal temperature of the semiconductor memory device is high, since the amount of charges supplied to the node nd26 through the PMOS transistor P21 included in the first current mirror unit 224 is decreased and the amount of charges discharged from the node nd26 through the first driving force adjustment unit 226 is increased, the pull-down signal NDRV generated in the node nd26 is generated at a lower level.

Meanwhile, the transfer gate T22 of the second driving force adjustment unit 244 that receives the temperature signal TEMP at the low level is turned on, so that the driving force of the second driving force adjustment unit 244 that pull-up drives the node nd29 is increased. Thus, when the internal temperature of the semiconductor memory device is high, the amount of charges supplied to the node nd29 through the second driving force adjustment unit 244 is increased, so that the pull-up signal PDRV generated in the node nd29 is generated at a higher level.

Next, the driving unit 26 receives the pull-down signal NDRV formed at the lower level and the pull-up signal PDRV formed at the higher level and drives the internal voltage VBLP/VCP, so that the turn-on degree of the PMOS transistor P27 and the NMOS transistor N29 is decreased. Thus, the driving force that drives the internal voltage VBLP/VCP is decreased.

At this time, the transfer gate T23 included in the pull-up driving section 260 is turned on by the temperature signal TEMP at the low level and the PMOS transistor P28 is turned on, so that the turn-on degree of the PMOS transistor P29 is reduced. Thus, the driving force of the pull-up driving section 260 that pull-up drives the internal voltage VBLP/VCP is decreased. Further, the transfer gate T24 included in the pull-down driving section 262 is turned off by the temperature signal TEMP at the low level and the NMOS transistor N30 is turned on, so that the turn-on degree of the NMOS transistor N31 is reduced. Thus, the driving force of the pull-down driving section 262 that pull-down drives the internal voltage VBLP/VCP is decreased.

In brief, the internal voltage generating circuit 2 of the present embodiment generates the pull-up signal PDRV at the higher level at the high temperature and decreases the number of drivers that drives the pull-up signal PDRV. Then, the internal voltage generating circuit 2 pull-up drives the internal voltage VBLP/VCP with lower driving force when the level of the internal voltage VBLP/VCP is lower than that of the level signal Level, thereby decreasing the driving force increased proportionally to the temperature. Further, the internal voltage generating circuit 2 of the present embodiment generates the pull-down signal NDRV at the lower level at the high temperature and decreases the number of drivers that drives the pull-down signal NDRV. Then, the internal voltage generating circuit 2 pull-down drives the internal voltage VBLP/VCP with lower driving force when the level of the internal voltage VBLP/VCP is higher than that of the level signal Level, thereby decreasing the driving force increased proportionally to the temperature.

Tables 2 and 3 below show the difference of driving current through the driving unit 26 generated according to change in skew conditions of the MOS transistor at the high temperature of 90° C. and low temperature of −40° C. For example, at the high temperature of 90° C., when the skew condition of the MOS transistor is SLOW and the level (0.62V) of the internal voltage VBLP/VCP is lower than the level (0.72V) of the level signal Level, the driving current of the driven pull-up driving section 260 is 3.11 A. When the level (0.82V) of the internal voltage VBLP/VCP is higher than the level (0.72V) of the level signal Level, the driving current of the driven pull-down driving section 262 is 1.62 A. At the low temperature of −40° C., when the skew condition of the MOS transistor is SLOW and the level (0.62V) of the internal voltage VBLP/VCP is lower than the level (0.72V) of the level signal Level, the driving current of the driven pull-up driving section 260 is 1.84 A. When the level (0.82V) of the internal voltage VBLP/VCP is higher than the level (0.72V) of the level signal Level, the driving current of the driven pull-down driving section 262 is 0.88 A. Accordingly, as compared with the prior art, at the high temperature of 90° C. and low temperature of −40° C., the difference between the driving currents of the pull-up driving section 260 is reduced and the difference between the driving currents of the pull-down driving section 262 is also reduced.

TABLE 2

| 90° | 0.62 V | 0.72 V | 0.82 V |
|---|---|---|---|
| TYPICAL | 4.84 | 0 | 3.20 |
| SLOW | 3.11 | 0 | 1.62 |
| FAST | 5.21 | 0 | 6.55 |
| SF | 5.00 | 0 | 2.12 |
| SF | 3.15 | 0 | 5.37 |

TABLE 3

| −40° | 0.62 V | 0.72 V | 0.82 V |
|---|---|---|---|
| TYPICAL | 5.47 | 0 | 2.15 |
| SLOW | 1.84 | 0 | 0.88 |
| FAST | 12.30 | 0 | 4.90 |
| SF | 12.10 | 0 | 0.93 |
| SF | 1.92 | 0 | 4.68 |

The above specific examples and embodiments are illustrative, and many variations can be introduced on such examples embodiments without departing from the spirit of the disclosure or from the scope of the appended claims. For example, elements and/or features of different examples and illustrative embodiments may be combined with each other and/or substituted for each other within the scope of this disclosure and appended claims.

The present disclosure claims priority to Korean application number 10-2007-0141042, filed on Dec. 28, 2007, the entire contents of which are incorporated herein by reference.

What is claimed is:

1. An internal voltage generating circuit comprising:
 a voltage divider for generating a level signal by voltage-dividing first internal voltage;
 a pull-down signal generator for generating a pull-down signal, in response to the level signal, the pull-down signal having a level adjusted according to a temperature;
 a pull-up signal generator for generating a pull-up signal, in response to the level signal, the pull-up signal having a level adjusted according to the temperature; and
 a driving unit for driving second internal voltage in response to the pull-down signal and the pull-up signal,
 wherein a driving force of the driving unit for driving the second internal voltage is changed according to the temperature.

2. The internal voltage generating circuit of claim 1, wherein the voltage divider includes:
 a first resistor connected between the first internal voltage and a first node through which the level signal is output; and
 a second resistor connected between the first node and ground voltage.

3. The internal voltage generating circuit of claim 2, wherein the pull-down signal generator includes:
 a first pull-up device for pull-up driving a second node in response to the level signal;
 a first level setting unit for setting a level of a third node in response to a signal of the second node;
 a second level setting unit for receiving the signal of the second node and set a level of a fourth node according to the temperature;
 a first current mirror unit connected to the first node, to which the level signal is input, and a fifth node, to which the second internal voltage is input, to serve as a constant current source in response to a signal of the fourth node; and
 a first driving force adjustment unit for pull-down driving a sixth node, through which the pull-down signal is output, in response to the signal of the second node while adjusting pull-down driving force according to the temperature.

4. The internal voltage generating circuit of claim 3, wherein the second level setting unit includes:
 a transfer device for transferring the signal of the second node to a seventh node in response to a temperature signal enabled at a low temperature;
 a first pull-down device for pull-down driving the seventh node in response to the temperature signal; and
 a second pull-down device for pull-down driving the fourth node in response to a signal of the second node.

5. The internal voltage generating circuit of claim 3, wherein the first driving force adjustment unit includes:
 a first pull-down device for pull-down driving the sixth node in response to the signal of the second node;
 a transfer device for transferring the signal of the second node to a seventh node in response to a temperature signal enabled at a low temperature;
 a second pull-down device for pull-down driving the seventh node in response to the temperature signal; and
 a third pull-down device for pull-down driving the sixth node in response to a signal of the seventh node.

6. The internal voltage generating circuit of claim 3, wherein the pull-up signal generator includes:
 a third level setting unit connected to the first internal voltage to set a level of a seventh node in response to a signal of the third node;
 a second current mirror unit connected to the first and fifth nodes to serve as a constant current source in response to a signal of a seventh node; and
 a second driving force adjustment unit for pull-up driving an eighth node, through which the pull-up signal is output, in response to a signal of the third node while adjusting pull-up driving force according to the temperature.

7. The internal voltage generating circuit of claim 6, wherein the second driving force adjustment unit includes:
 a second pull-up device for pull-up driving the eighth node in response to the signal of the third node;
 a transfer device for transferring the signal of the third node to a ninth node in response to a temperature signal enabled at a low temperature;
 a third pull-up device for pull-up driving the ninth node in response to the temperature signal; and
 a fourth pull-up device for pull-up driving the eighth node in response to a signal of the ninth node.

8. The internal voltage generating circuit of claim 1, wherein the driving unit includes:
 a pull-up driving section for pull-up driving the second internal voltage in response to the pull-up signal while adjusting pull-up driving force according to the temperature; and
 a pull-down driving section for pull-down driving the second internal voltage in response to the pull-down signal while adjusting pull-down driving force according to the temperature.

9. The internal voltage generating circuit of claim 8, wherein the pull-up driving section includes:
 a first pull-up device for pull-up driving a first node, through which the second internal voltage is output, in response to the pull-up signal;

a transfer device for transferring the pull-up signal to a second node in response to a temperature signal enabled at a low temperature;
a second pull-up device for pull-up driving the second node in response to the temperature signal; and
a third pull-up device for pull-up driving the first node in response to a signal of the second node.

10. The internal voltage generating circuit of claim 8, wherein the pull-down driving section includes:
a first pull-down device for pull-down driving a first node, through which the second internal voltage is output, in response to the pull-down signal;
a transfer device for transferring the pull-up signal to a second node in response to a temperature signal enabled at a low temperature;
a second pull-down device for pull-down driving the second node in response to the temperature signal; and
a third pull-down device for pull-down driving the first node in response to a signal of the second node.

11. A semiconductor memory device comprising:
a temperature sensor for generating a temperature signal enabled at a low temperature; and
an internal voltage generating circuit configured to receive a first internal voltage, generate a pull-down signal and a pull-up signal having a level adjusted according to a temperature, and drive a second internal voltage in response to the pull-down signal and the pull-up signal.

12. The semiconductor memory device of claim 11, wherein the internal voltage generating circuit includes:
a voltage divider for generating a level signal by voltage-dividing the first internal voltage;
a pull-down signal generator for generating the pull-down signal, in response to the level signal;
a pull-up signal generator for generating the pull-up signal, in response to the level signal; and
a driving unit for driving second internal voltage in response to the pull-down signal and the pull-up signal, wherein a driving force of the driving unit for the second internal voltage is changed according to the temperature.

13. The semiconductor memory device of claim 12, wherein the voltage divider includes:
a first resistor connected between the first internal voltage and a first node through which the level signal is output; and
a second resistor connected between the first node and ground voltage.

14. The semiconductor memory device of claim 13, wherein the pull-down signal generator includes:
a first pull-up device for pull-up driving a second node in response to the level signal;
a first level setting unit for setting a level of a third node in response to a signal of the second node;
a second level setting unit for receiving the signal of the second node and set a level of a fourth node according to the temperature;
a first current mirror unit connected to the first node, to which the level signal is input, and a fifth node, to which the second internal voltage is input, to serve as a constant current source in response to a signal of the fourth node; and
a first driving force adjustment unit for pull-down driving a sixth node, through which the pull-down signal is output, in response to the signal of the second node while adjusting a pull-down driving force according to the temperature.

15. The semiconductor memory device of claim 14, wherein the second level setting unit includes:

a transfer device for transferring the signal of the second node to a seventh node in response to a temperature signal enabled at a low temperature;
a first pull-down device for pull-down driving the seventh node in response to the temperature signal; and
a second pull-down device for pull-down driving the fourth node in response to a signal of the second node.

16. The semiconductor memory device of claim 14, wherein the first driving force adjustment unit includes:
a first pull-down device for pull-down driving the sixth node in response to the signal of the second node;
a transfer device for transferring the signal of the second node to a seventh node in response to a temperature signal enabled at a low temperature;
a second pull-down device for pull-down driving the seventh node in response to the temperature signal; and
a third pull-down device for pull-down driving the sixth node in response to a signal of the seventh node.

17. The semiconductor memory device of claim 14, wherein the pull-up signal generator includes:
a third level setting unit connected to the first internal voltage to set a level of a seventh node in response to a signal of the third node;
a second current mirror unit connected to the first and fifth nodes to serve as a constant current source in response to a signal of a seventh node; and
a second driving force adjustment unit for pull-up driving an eighth node, through which the pull-up signal is output, in response to a signal of the third node while adjusting a pull-up driving force according to the temperature.

18. The semiconductor memory device of claim 17, wherein the second driving force adjustment unit includes:
a second pull-up device for pull-up driving the eighth node in response to the signal of the third node;
a transfer device for transferring the signal of the third node to a ninth node in response to a temperature signal enabled at a low temperature;
a third pull-up device for pull-up driving the ninth node in response to the temperature signal; and
a fourth pull-up device for pull-up driving the eighth node in response to a signal of the ninth node.

19. The semiconductor memory device of claim 12, wherein the driving unit includes:
a pull-up driving section for pull-up driving the second internal voltage in response to the pull-up signal while adjusting a pull-up driving force according to the temperature; and
a pull-down driving section for pull-down driving the second internal voltage in response to the pull-down signal while adjusting a pull-down driving force according to the temperature.

20. The semiconductor memory device of claim 19, wherein the pull-up driving section includes:
a first pull-up device for pull-up driving a first node, through which the second internal voltage is output, in response to the pull-up signal;
a transfer device for transferring the pull-up signal to a second node in response to a temperature signal enabled at a low temperature;
a second pull-up device for pull-up driving the second node in response to the temperature signal; and
a third pull-up device for pull-up driving the first node in response to a signal of the second node.

21. The semiconductor memory device of claim 19, wherein the pull-down driving section includes:

a first pull-down device for pull-down driving a first node, through which the second internal voltage is output, in response to the pull-down signal;

a transfer device for transferring the pull-up signal to a second node in response to a temperature signal enabled at a low temperature;

a second pull-down device for pull-down driving the second node in response to the temperature signal; and a third pull-down device for pull-down driving the first node in response to a signal of the second node.

22. The semiconductor memory device of claim 11, wherein the second internal voltage is supplied as bit line precharge voltage or cell plate voltage.

* * * * *